United States Patent
Suzuki et al.

(10) Patent No.: US 8,476,714 B2
(45) Date of Patent: Jul. 2, 2013

(54) SEMICONDUCTOR DEVICE

(75) Inventors: Jun Suzuki, Toyama (JP); Hiroshi Nakagawa, Toyama (JP)

(73) Assignee: Panasonic Corporation, Osaka (JP)

(*) Notice: Subject to any disclaimer, the term of this patent is extended or adjusted under 35 U.S.C. 154(b) by 93 days.

(21) Appl. No.: 13/005,196

(22) Filed: Jan. 12, 2011

(65) Prior Publication Data
US 2011/0108924 A1  May 12, 2011

Related U.S. Application Data (63) Continuation of application No. PCT/JP2009/004439, filed on Sep. 8, 2009.

(30) Foreign Application Priority Data

Nov. 12, 2008  (JP) .................................. 2008-289773

(51) Int. Cl.
H01L 21/70  (2006.01)

(52) U.S. Cl.
USPC ............. 257/369; 257/E27.062; 257/E21.638

(58) Field of Classification Search
USPC ........................ 257/369, E27.062, E21.638
See application file for complete search history.

(56) References Cited

U.S. PATENT DOCUMENTS

| 2004/0108575 | A1* | 6/2004 | Ohmi et al. .................... 257/627 |
| 2005/0048725 | A1 | 3/2005 | Shibahara |
| 2006/0043497 | A1 | 3/2006 | Kimizuka et al. |
| 2006/0068575 | A1* | 3/2006 | Gluschenkov et al. ....... 438/585 |
| 2007/0052036 | A1 | 3/2007 | Luan et al. |
| 2007/0126062 | A1 | 6/2007 | Akiyama et al. |
| 2007/0145493 | A1 | 6/2007 | Koyama et al. |
| 2007/0152273 | A1 | 7/2007 | Callegari et al. |
| 2007/0178634 | A1* | 8/2007 | Jung et al. ..................... 438/199 |
| 2008/0096383 | A1 | 4/2008 | Tigelaar et al. |
| 2008/0135944 | A1 | 6/2008 | Ichihara et al. |
| 2008/0191286 | A1 | 8/2008 | Chang et al. |
| 2008/0203488 | A1* | 8/2008 | Chung et al. .................. 438/199 |
| 2009/0275179 | A1* | 11/2009 | Basker et al. ................. 438/231 |

FOREIGN PATENT DOCUMENTS

| JP | 2003-289140 A | 10/2003 |
| JP | 2006-093670 A | 6/2006 |
| JP | 2006-165090 A | 6/2006 |
| JP | 2007-110091 A | 1/2007 |
| JP | 2007-142153 A | 5/2007 |
| JP | 2007-184584 A | 7/2007 |
| JP | 2008-147239 A | 6/2008 |
| JP | 2008-166713 A | 6/2008 |
| JP | 2008-166716 A | 6/2008 |
| JP | 2008-211182 A | 8/2008 |
| JP | 2008-219006 A | 8/2008 |

* cited by examiner

*Primary Examiner* — Kimberly Rizkallah
*Assistant Examiner* — Timor Karimy
(74) *Attorney, Agent, or Firm* — McDermott Will & Emery LLP (57) ABSTRACT

A semiconductor device includes a semiconductor substrate; an n-channel MOS transistor including a first gate insulating film provided on a p-type layer, a first gate electrode made of TiN, and a first upper gate electrode made of semiconductor doped with impurities; and a p-channel MOS transistor including a second gate insulating film provided on an n-type layer, a second gate electrode including at least as a part, a TiN layer made of TiN crystal in which a ratio of (111) orientation/(200) orientation is about 1.5 or more, and a second upper gate electrode made of semiconductor doped with impurities.

12 Claims, 9 Drawing Sheets

SEMICONDUCTOR DEVICE

CROSS-REFERENCE TO RELATED APPLICATION

This is a continuation of PCT International Application PCT/JP2009/004439 filed on Sep. 8, 2009, which claims priority to Japanese Patent Application No. 2008-289773 filed on Nov. 12, 2008. The disclosures of these applications including the specifications, the drawings, and the claims are hereby incorporated by reference in their entirety.

BACKGROUND

The present disclosure relates to semiconductor devices, and more particularly to semiconductor devices including high-dielectric constant gate insulating films and methods of manufacturing the devices.

With higher integration and higher operational speed of semiconductor devices, miniaturization of transistors has progressed. A complementary MOS (CMOS) device is provided with two transistors of an n-channel MOS transistor (hereinafter referred to as an "NMOS") and a p-channel MOS transistor (hereinafter referred to as a "PMOS"). The NMOS controls on and off of currents by transfer of electrons, and the PMOS controls currents by transfer of holes.

Conventionally, gate insulating films being silicon oxide films having a dielectric constant of about 3.9 have been used for CMOS devices. However, when the thickness of a gate insulating film which is a silicon oxide film is reduced with miniaturization of a transistor, a leakage current increases, thereby increasing power consumption and standby electricity of a device. Thus, a gate insulating film has been developed, which is made of a high-k material having a dielectric constant of 4.0 or more, and of which equivalent oxide thickness (EOT) can be reduced, even when the actual thickness is formed large as compared to the case where a silicon oxide film is used.

However, simply by a combination of a high-k gate insulating film and a gate electrode made of polysilicon, which has been conventionally used, a phenomenon called "depletion" of the gate electrode occurs to damage the advantage of the high-k gate insulating film of having a small EOT. In the conventional gate electrode, impurities such as boron, phosphorus, etc. are ion-implanted into the polysilicon and activated by heat treatment, and then, the work function of the polysilicon is improved from 4.65 eV in an undoped state to 5.15 eV by ion-implanting boron, thereby controlling threshold voltages of the NMOS and the PMOS. However, when a high-k gate insulating film is used, Fermi level pinning occurs so that the work function cannot be changed by the ion implantation. Therefore, in order to reduce the depletion of the gate electrode, a high-k gate insulating film is essentially combined with a metal gate electrode. However, in a structure called "metal inserted poly-Si stack (MIPS)," in which a metal gate electrode and a polysilicon gate electrode are combined, the work function of the metal used for the gate electrode dominantly influences threshold values, and the work function is difficult to control by ion implantation. In research of work functions of a high-k gate insulating film and a metal gate electrode, the use of a nitride of titanium, tungsten, tantalum, and molybdenum has been considered. In particular, a nitride of titanium and tungsten, which has been conventionally used, is manageable as a material of a metal gate electrode in a dynamic random access memory (DRAM) in view of processing characteristics of dry etching, wet etching, etc.

SUMMARY

The work function of a titanium nitride film (TiN film) largely depends on the thickness of the film. The thickness of the TiN film is formed large in a p-channel gate electrode which requires a large work function, and formed small in an n-channel gate electrode which requires a small work function, thereby changing the work function of the gate electrodes.

However, when the thickness of the TiN film increases, the EOT also increases. Thus, when TiN is used in the form of a thick film, the reduction in the EOT obtained in a high-k gate insulating film is canceled. Since the gate insulating films of an NMOS and a PMOS have different EOTs, problems may occur in the operation of a CMOS.

A semiconductor device according to an embodiment of the present disclosure realizes a high-function CMOS transistor, even when the transistor includes a high-k gate insulating film and is miniaturized.

In order to solve the problems, a semiconductor device according to an example of the present disclosure includes a semiconductor substrate including a p-type layer and an n-type layer in an upper portion; an n-channel MOS transistor including a first gate insulating film provided on the p-type layer, a first gate electrode provided on the first gate insulating film and made of TiN, and a first upper gate electrode provided on the first gate electrode and made of semiconductor doped with impurities; and a p-channel MOS transistor including a second gate insulating film provided on the n-type layer, a second gate electrode provided on the second gate insulating film, and including at least as a part, a TiN layer made of TiN crystal in which a ratio of (111) orientation/(200) orientation is about 1.5 or more, and a second upper gate electrode provided on the second gate electrode and made of semiconductor doped with impurities.

In this structure, the second gate electrode of the p-channel MOS transistor includes at least as a part, the TiN layer in which the ratio of (111) orientation/(200) orientation is about 1.5 or more. This mitigates an increase in the EOT even when the thickness of the second gate electrode is increased to obtain a higher work function. Thus, the work functions of the gate electrodes of the p-channel MOS transistor and the n-channel MOS transistor can be set to appropriate values, and the difference in the EOT between the transistors can be reduced. Therefore, a high-function CMOS transistor can be realized even when the CMOS transistor is miniaturized.

The entire second gate electrode is preferably made of TiN crystal in which the ratio of (111) orientation/(200) orientation is about 1.5 or more, and the first gate electrode is preferably made of TiN crystal, in which the ratio of (111) orientation/(200) orientation is about 1.5 or more, and which has a smaller thickness than the second gate electrode. This is because the work function of the gate electrode of the n-channel MOS transistor can be reduced and the work function of the gate electrode of the p-channel MOS transistor can be increased.

The second gate electrode preferably has a thickness of about 15 nm or more, since the work function of the gate electrode of the p-channel MOS transistor can be increased.

The first gate electrode is preferably made of TiN crystal in which the ratio of (111) orientation/(200) orientation ranges from about 0.8 to about 1.2, and the first gate electrode preferably has a thickness ranging from about 4 nm to about 10 nm, since the EOT of the n-channel MOS transistor can be reduced.

The second gate electrode may include a first TiN layer made of TiN crystal in which the ratio of (111) orientation/(200) orientation ranges from about 0.8 to about 1.2, and a second TiN layer made of TiN crystal in which the ratio of (111) orientation/(200) orientation is about 1.5 or more.

La or Mg may segregate inside the first gate insulating film, or at an interface between the first gate insulating film and the first gate electrode. Al or Ta may segregate inside the second gate insulating film, or at an interface between the second gate insulating film and the second gate electrode.

The first gate insulating film and the second gate insulating film may be made of a high-dielectric constant material.

A method of manufacturing a semiconductor device according to an example of the present disclosure includes the steps of (a) forming a p-type layer and an n-type layer in an upper portion of a semiconductor substrate; and (b) forming on the p-type layer, an n-channel MOS transistor including from bottom, a first gate insulating film, a first gate electrode made of TiN, and a first upper gate electrode made of semiconductor doped with impurities, and forming on the n-type layer, a p-channel MOS transistor including from bottom, a second gate insulating film, a second gate electrode including at least as a part, a TiN layer made of TiN crystal in which a ratio of (111) orientation/(200) orientation is about 1.5 or more, and a second upper gate electrode made of semiconductor doped with impurities.

According to this method, the TiN layer, in which the ratio of (111) orientation/(200) orientation is about 1.5 or more, is provided at least as a part of the second gate electrode of the p-channel MOS transistor. This increases the thickness of the second gate electrode to increase the work function, and mitigates an increase in the EOT. As a result, the work functions of the gate electrodes of the p-channel MOS transistor and the n-channel MOS transistor can be set to appropriate values, and the difference in the EOT between the transistors can be reduced. Therefore, a high-function CMOS transistor can be realized even when the CMOS transistor is miniaturized.

The step (b) may include the steps of (b1) forming an insulating film on the semiconductor substrate, (b2) forming on the insulating films a TiN layer in which the ratio of (111) orientation/(200) orientation is about 1.5 or more by setting a space between a gas supply port and the semiconductor substrate to about 25 mm or more and by alternately supplying material gas of Ti and N at about 66.7 Pa or less, (b3) selectively removing a part of the TiN layer located above the p-type layer so that a thickness of the TiN layer above the p-type layer is smaller than that of the TiN layer above the n-type layer, (b4) forming a semiconductor film on the TiN layer, and (b5) patterning the semiconductor layer, the TiN layer, and the insulating film to form on the p-type layer, the first gate insulating film being a part of the insulating film, the first gate electrode being a part of the TiN layer, and the first upper gate electrode being a part of the semiconductor film, and to form on the n-type layer, the second gate insulating film being a part of the insulating film, the second gate electrode being a part of the TiN layer, and the second upper gate electrode being a part of the semiconductor film. Note that, the crystal orientation of TiN can be controlled by controlling pressure in a chamber and the space between the gas supply port and the semiconductor substrate. For example, the pressure in the chamber is reduced, and the space between the gas supply port and the semiconductor substrate is increased, thereby selectively forming the TiN layer in which the ratio of (111) orientation/(200) orientation is about 1.5 or more.

Moreover, the second gate electrode may include a lower layer gate electrode, and an upper layer gate electrode provided on the lower layer gate electrode. The step (b) may include the steps of (b6) forming an insulating film on the semiconductor substrate, (b7) forming on the insulating film, a first TiN layer in which the ratio of (111) orientation/(200) orientation ranges from about 0.8 to about 1.2 by setting a space between a gas supply port and the semiconductor substrate to about 20 mm or less and by alternately supplying material gas of Ti and N at about 400 Pa or more, (b8) forming on the first TiN layer, a second TiN layer in which the ratio of (111) orientation/(200) orientation is about 1.5 or more by setting the space between the gas supply port and the semiconductor substrate to about 25 mm or more and by alternately supplying the material gas of Ti and N at about 66.7 Pa or less, (b9) selectively removing a part of the second TiN layer located above the p-type layer, (b10) forming a semiconductor film on the first TiN layer and the second TiN layer, and (b11) patterning the semiconductor layer, the second TiN layer, the first TiN layer, and the insulating film to form on the p-type layer, the first gate insulating film being a part of the insulating film, the first gate electrode being a part of the first TiN layer, and the first upper gate electrode being a part of the semiconductor film, and to form on the n-type layer, the second gate insulating film being a part of the insulating film, the lower layer gate electrode being a part of the first TiN layer, the upper layer gate electrode being a part of the second TiN layer, and the second upper gate electrode being a part of the semiconductor film.

Furthermore, the second gate electrode may include a lower layer gate electrode, and an upper layer gate electrode provided on the lower layer gate electrode. The step (b) includes the steps of (b12) forming an insulating film on the semiconductor substrate, (b13) forming on the insulating film, a first segregation layer made of any one of an Al oxide, a Ta oxide, an Al nitride, and a Ta nitride, (b14) forming on the first segregation layer, a first TiN layer in which the ratio of (111) orientation/(200) orientation ranges from about 0.8 to about 1.2 by setting a space between a gas supply port and the semiconductor substrate to about 20 mm or less and by alternately supplying material gas of Ti and N at about 400 Pa or more, (b15) removing a part of the first TiN layer located above the p-type layer, (b16) after the step (b15), selectively forming above the p-type layer and on the insulating film and the first TiN layer, a second segregation layer made of any one of a La oxide, a Mg oxide, a La nitride, and a Mg nitride, (b17) performing heat treatment to allow La or Mg to segregate inside the insulating film or in a part of a top surface of the insulating film formed above the p-type layer, and to allow Al or Ta to segregate inside the insulating film or in a part of the top surface of the insulating film formed above the n-type layer, (b18) forming on the second segregation layer and the first TiN layer, a second TiN layer in which the ratio of (111) orientation/(200) orientation is about 1.5 or more by setting the space between the gas supply port and the semiconductor substrate to about 25 mm or more and by alternately supplying the material gas of Ti and N at about 66.7 Pa or less, (b19) forming a semiconductor film on the second TiN layer, and (b20) patterning the semiconductor layer, the second TiN layer, the first TiN layer, the second segregation layer, the first segregation layer, and the insulating film to form on the p-type layer, the first gate insulating film being a part of the insulating film, a second element segregation layer being a part of the second segregation layer, the first gate electrode being a part of the second TiN layer, and the first upper gate electrode being a part of the semiconductor film, and to form on the n-type layer, the second gate insulating film being a part of the insulating film, a first element segregation layer being a part of the first segregation layer, the lower layer gate electrode being a part of the first TiN layer, the upper layer gate electrode being a part of the second TiN layer, and the second upper gate electrode being a part of the semiconductor film.

According to embodiments of the present disclosure, the crystal orientation ratio of the gate electrodes made of TiN, which are formed in the p-channel MOS transistor and the n-channel MOS transistor, can be appropriately set, thereby mitigating an increase in the EOT and obtaining a high work function. Therefore, further miniaturization and an improvement in a function of a CMOS can be achieved, when, for example, a gate insulating film made of a high-k material and a metal gate electrode made of TiN are combined.

DETAILED DESCRIPTION

First Embodiment

A semiconductor manufacturing apparatus according to a first embodiment of the present disclosure and a manufacturing method of a semiconductor device using the apparatus will be described hereinafter with reference to the drawings.

Figure 1:
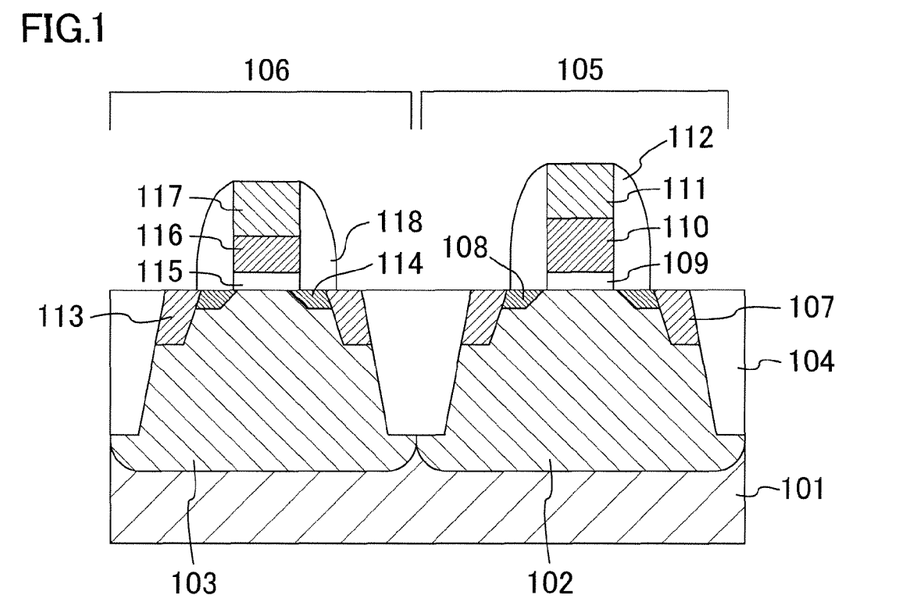
FIG. 1 is a cross-sectional view illustrating a schematic structure of a semiconductor device according to a first embodiment of the present disclosure.

FIG. 1 is a cross-sectional view illustrating a schematic structure of a semiconductor device according to the first embodiment of the present disclosure. The figure shows an NMOS 106 and a PMOS 105, which form a CMOS.

As shown in FIG. 1, in the semiconductor device according to this embodiment, a p-type well region 103 and an n-type well region 102 are provided in an upper portion of a semiconductor substrate 101 made of silicon. The p-type well region 103 and the n-type well region 102 are surrounded by an isolation layer 104 formed by silicon oxide films etc., and electrically isolated from each other. The isolation layer 104 is in the form of, for example, shallow trench isolation (STI). An NMOS 106 is provided on the p-type well region 103, and a PMOS 105 is provided on the n-type well region 102.

The NMOS 106 includes a first gate insulating film 115 provided on the p-type well region 103, and made of a high-k material; a first gate electrode 116 provided on the first gate insulating film 115, and made of TiN; a first upper gate electrode 117 provided on the first gate electrode 116, and made of polysilicon doped with n-type impurities such as phosphorus; first side walls 118 provided on side surfaces of the first gate insulating film 115, the first gate electrode 116, and the first upper gate electrode 117, and formed of a silicon oxide film, a silicon nitride film, etc.; an n-type extension layer 114 provided directly under the first side walls 118 in the p-type well region 103, and doped with n-type impurities; and an n-type impurity diffusion layer 113 provided in regions located on both sides of the first gate electrode 116, the first upper gate electrode 117, and the first side walls 118 in the p-type well region 103, being in contact with the n-type extension layer 114, and doped with n-type impurities at a higher concentration than the n-type extension layer 114. The n-type impurity diffusion layer 113 and the n-type extension layer 114 form an n-type source/drain region. Silicide layers made of nickel silicide (NiSi) or nickel platinum silicide (NiPtSi) are formed on the n-type source/drain region and the first upper gate electrode 117. A carbon doped Si epitaxial layer containing 1% to 3% of carbon (C) may be provided in the n-type source/drain region.

The PMOS 105 includes a second gate insulating film 109 provided on the n-type well region 102, and made of a high-k material; a second gate electrode 110 provided on the second gate insulating film 109, and made of TiN; a second upper gate electrode 111 provided on the second gate electrode 110, and made of polysilicon doped with n-type impurities such as boron; second side walls 112 provided on side surfaces of the second gate insulating film 109, the second gate electrode 110, and the second upper gate electrode 111, and formed of a silicon oxide film, a silicon nitride film, etc.; a p-type extension layer 108 provided directly under the second side walls 112 in the n-type well region 102, and doped with p-type impurities; and a p-type impurity diffusion layer 107 provided in regions located on both sides of the second gate electrode 110, the second upper gate electrode 111, and a second side walls 112 in the n-type well region 102, being in contact with the p-type extension layer 108, and doped with p-type impurities at a higher concentration than the p-type extension layer 108. The p-type impurity diffusion layer 107 and the p-type extension layer 108 form a p-type source/drain region. Silicide layers made of nickel silicide (NiSi) or nickel platinum silicide (NiPtSi) are formed on the p-type source/drain region and the second upper gate electrode 111. A SiGe epitaxial layer containing 10% to 30% of germanium (Ge) may be provided in the p-type source/drain region. The first upper gate electrode 117 and the second upper gate electrode 111 may be made of semiconductor doped with impurities such as silicon germanium other than polysilicon.

In the semiconductor device according to this embodiment, equivalent oxide thicknesses (EOTs) of the first gate electrode 116 made of TiN and the second gate electrode 110 are not controlled by the thicknesses of the TiN films, but by crystallinity of the TiN films. Specifically, in the first gate electrode 116 and the second gate electrode 110, fluctuations in the EOT are reduced by controlling the crystallinity of the TiN films. Conventionally, such a technique of reducing fluctuations in an EOT by controlling crystallinity of a metal gate electrode has not been known at all. In a gate electrode of a CMOS, EOTs of gate insulating films of an NMOS and a PMOS need to be roughly equivalent to each other to stabilize the operation. In consideration of these respects, the present inventors repeated researches, and arrived at the present disclosure. The detail will be described below.

In the semiconductor device according to this embodiment, the composition ratio of N/Ti forming the first gate electrode 116 and the second gate electrode 110 is set within a range from 1.0 to 1.2, and TiN is used in a crystal state. The present inventors found that an increase in the EOT can be mitigated until the thickness of the TiN film reaches about 25 nm by increasing the ratio of (111) orientation to (200) orientation in the crystal of TiN, and applied this feature to a CMOS transistor.

Figure 2:
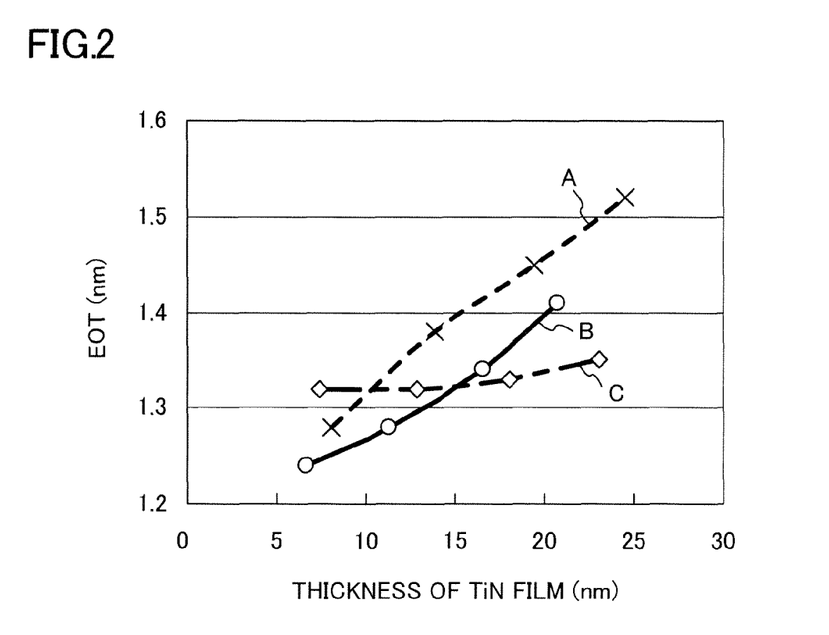
FIG. 2 illustrates the relationship between the thickness of a TiN film and an EOT.

FIG. 2 illustrates the relationship between the thickness of a TiN film and an EOT. As indicated by graph A in the figure, the EOT monotonically increases with respect to the thickness of a TiN film used in conventional techniques. In this case, when the thickness of the TiN film is increased to improve the work function, the EOT also increases against miniaturization. TiN tends to form columnar crystal, and the crystal of the (200) orientation is dominant in TiN used in the conventional gate electrode. As indicated by graph C, no significant change in the EOT is found in the TiN film used in this embodiment when the thickness of the TiN film is within the measured range (from 5 nm to 25 nm). In the TiN film used for the gate electrode in this embodiment, the ratio of the (111) orientation to the (200) orientation (hereinafter referred to as "the ratio of (111) orientation/(200) orientation" etc.) is increased as compared to the conventional techniques. Graph B indicates the measurement result of TiN having crystallinity intermediate between the TiN films of the graphs A and C.

Figure 3:
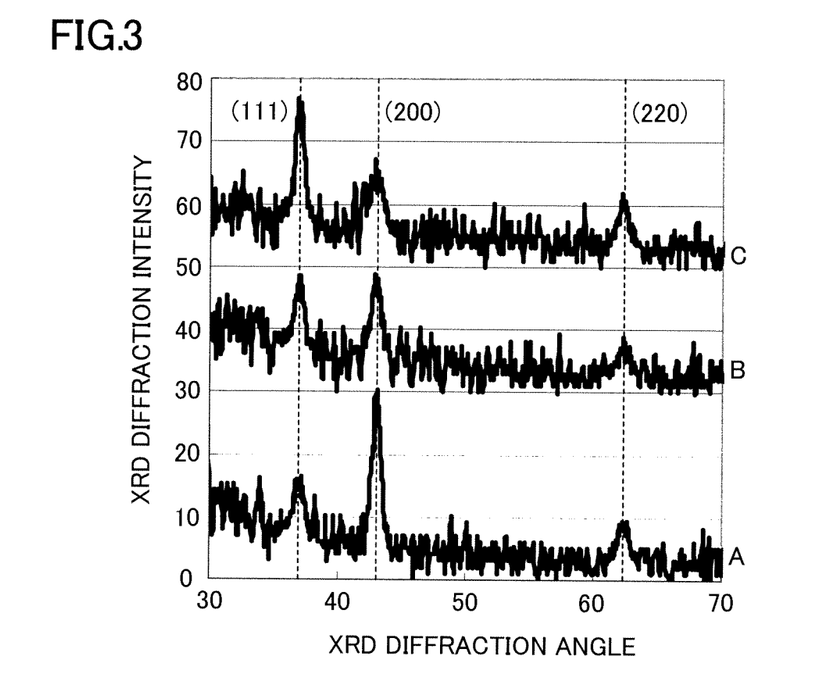
FIG. 3 illustrates a result of X-ray diffraction (XRD) for crystal analysis of a TiN thin film with a thickness of 15 nm.

FIG. 3 illustrates a result of X-ray diffraction (XRD) for crystal analysis of a TiN thin film with a thickness of 15 nm. Out-of-plane measurements called "θ/2θ scans" are used. The horizontal axis represents a diffraction angle (2θ), and the vertical axis represents diffraction intensity of the X-ray. In order to easily distinguish the differences in the spectrums, offsets in the vertical axis direction are added to the spectrums. While the ratio of titanium to nitrogen (Ti/N) in the TiN film is about 1.1, the film can be formed in the following two states: where the diffraction peak of a (111) plane is dominant ("C" in FIG. 3), and where the diffraction peak of a (200) plane is dominant ("A" in FIG. 3). As indicated by B in FIG. 3, the diffraction peak of the crystal along the (111) plane may be equal to the diffraction peak of the crystal along the (200) plane.

As can be seen from above description, the fluctuations in the EOT can be reduced by changing the crystal orientation of TiN, even when the thickness of the TiN film is increased. This is the matter uniquely found by the present inventors. While metal organic chemical vapor deposition (MOCVD), atomic layer deposition (ALD), physical vapor deposition (PVD), etc. are considered as a formation technique of the TiN film, the ALD capable of controlling atomic layers is the most preferable method for controlling the crystallinity.

Figure 4:
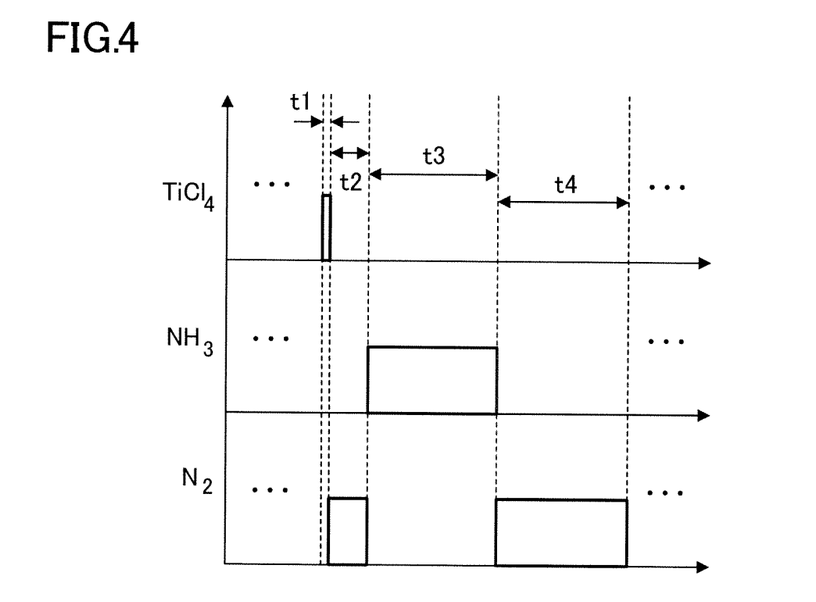
FIG. 4 illustrates a sequence of formation of the TiN film according to an example of the present disclosure.

When a TiN film is formed by ALD as shown in FIG. 4, a Ti source such as titanium chloride ($TiCl_4$) and a nitrogen source such as ammonia ($NH_3$) are alternately supplied to repeat the atomic layer deposition, thereby forming a film. There is no significant difference in the crystallinity of the TiN film, even when the supply time and flow rates of the Ti source and the nitrogen source are changed, and even when the temperature for the film formation is changed from 350° C. to 600° C.

The crystallinity of TiN largely depends on adsorption probability on a substrate surface per one cycle of ALD. The adsorption probability is largely influenced by pressure within a chamber. It is considered that, since gas-phase reaction is dominant in the bonding of Ti and nitrogen, crystallinity cannot change even when pressure in the chamber is changed in MOCDV or PVD. By contrast, in ALD, since surface reaction is dominant, crystallinity can be modulated by changing the pressure in the chamber.

When the pressure in the chamber is high, Ti atoms to adsorb onto a substrate adsorb and bond at high density. When continuing the ALD cycles in such a dense state, the bonding in the vertical direction progresses so that the crystallinity along the (200) plane is dominant. This increases the film thickness per one cycle and a deposition rate. On the other hand, when the pressure in the chamber is low, the Ti and N atoms adsorb and bond at low atomic density. This reduces the deposition rate. When bonding is performed at low density, not only a pair of Ti and N is bonded, but, e.g., a Ti atom is bonded to two N atoms with high probability when the atoms adsorb. Then, the bonding in an oblique direction progresses so that the crystallinity along the (111) plane is dominant.

Figure 5:
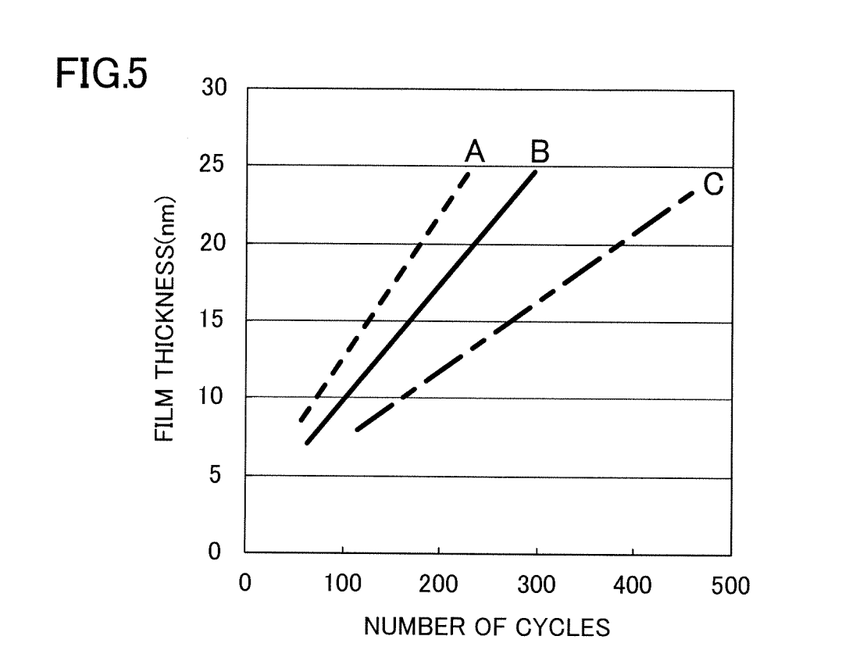
FIG. 5 illustrates a deposition rate under conditions for forming TiN films A, B, and C shown in FIG. 3.

FIG. 5 illustrates a deposition rate under conditions for forming TiN films A, B, and C shown in FIG. 3. The horizontal axis represents the number of ALD cycles, and the vertical axis represents the film thickness. The tilt of the graph represents the deposition rate. The larger the tilt is, the higher the deposition rate is; and the smaller the tilt is, the lower the deposition rate is. As described above, the deposition rate largely depends on the pressure in the chamber, and also depends on a space between a shower plate (gas supply port) and a wafer (stage heater).

The present inventors found that the crystal orientation of TiN could be freely changed by controlling the pressure in the chamber, and the space between the shower plate and the wafer, and changing the deposition rate. In the manufacturing method of the semiconductor device which will be described later, when the deposition rate is 0.08 nm/cycle or more, the (200) plane is dominant. When the deposition rate is 0.075 nm/cycle, the (111) plane and the (200) plane are included in substantially a same ratio. On the other hand, when the deposition rate is 0.06 nm/cycle or less, the (111) plane is dominant.

The deposition rate influences the number of processed wafers per unit time, which is called "through-put." With an increase in the deposition rate, the number of processed films per unit time increases. Thus, in mass production, film formation with high through-put has been preferred, and the crystal orientation of a conventional TiN film formed by ALD was dominantly the (200) plane.

Figure 6:
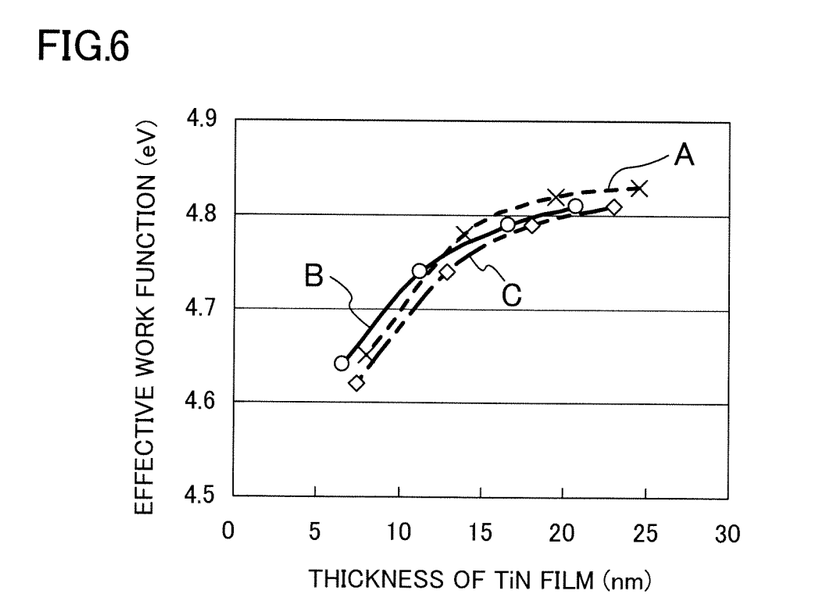
FIG. 6 illustrates a change in a work function with respect to the thickness of the TiN film when crystal orientation is changed.

FIG. 6 illustrates a change in a work function with respect to the thickness of the TiN film when crystal orientation is changed. As described in Japanese Patent Publication No. 2007-165414, the work function of tantalum carbide (TaC) can be largely changed by changing the crystal orientation. On the other hand, the work function of TiN is less influenced by the crystal orientation. When TiN in which the ratio of (111) orientation/(200) orientation is 1.5 or more is compared to TiN in which the ratio is 0.6 or less, the difference in the saturated work function is only 20 meV. It is found that the work function is dominantly influenced by the thickness of TiN.

When the (200) orientation is dominant in TiN, a crystal grain boundary of TiN is easily formed. It is considered that oxygen is diffused along the crystal grain boundary, from a high-k insulating film into a TiN film to form titanium oxide (TiOx), thereby increasing the EOT. While the difference in the orientation slightly influences the work function, the saturated amount of the work function is larger when the (200) orientation is dominant. This is considered because an electric dipole moment is increased by forming TiOx at the interference between the high-k gate insulating film and TiN.

On the contrary, when the (111) orientation of TiN is dominant, the crystal is grown in an oblique direction. It is considered that diffusion of oxygen from the high-k gate insulating film or from polysilicon (the upper gate electrode) can be reduced, thereby mitigating an increase in the EOT according to an increase in the thickness of the TiN film.

Note that, in the XRD analysis in FIG. 3, the X-ray needs to have a spot size of 100 μm×100 μm at minimum to improve diffraction intensity, and X-ray diffraction of a gate electrode of a transistor with a gate length of 50 nm or less is difficult to observe. However, crystal orientation can be easily analyzed by observing the cross-section of a gate electrode of a transistor with a transmission electron microscopy (TEM). Alternately, the ratio of the (111) crystal orientation to the (200) crystal orientation can be checked by electron diffraction.

Figure 7:
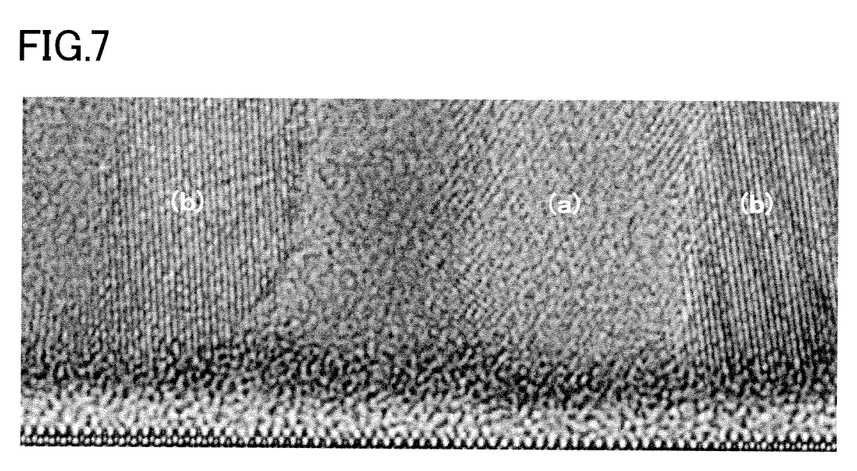
FIG. 7 illustrates a TEM image of the TiN film.

FIG. 7 illustrates a TEM image of the TiN film. It is found from the figure that part (a) represents an oblique crystal plane indicating the (111) plane, and part (b) represents a vertical crystal plane indicating the (200) plane.

As such, the present inventors researched physical properties of a TiN film in detail, and succeeded in mitigating an increase in the EOT when the thickness of the TiN film is increased by controlling the crystal orientation of TiN. The present disclosure was made based on the new finding, and provides features and advantages beyond conventional techniques.

As described above, in the semiconductor device according to this embodiment, the first gate electrode 116 and the second gate electrode 110 are made of Tin in which the (111) plane is dominant. Thus, the work functions of the gate electrodes of the PMOS and the NMOS can be set to appropriate values, and the difference in the EOT between the first gate electrode 116 and the second gate electrode 110 can be reduced. Furthermore, since the EOT can be reduced, the PMOS and the NMOS can operate properly to realize a miniaturized and high-function CMOS transistor.

Note that the thickness of the first gate electrode 116 preferably ranges from about 4 nm to about 10 nm, and the thickness of the second gate electrode 110 preferably ranges from about 15 nm to about 25 nm.

Next, a manufacturing method of the semiconductor device according to this embodiment will be described below with reference to FIGS. 8A-8E.

Figure 8:
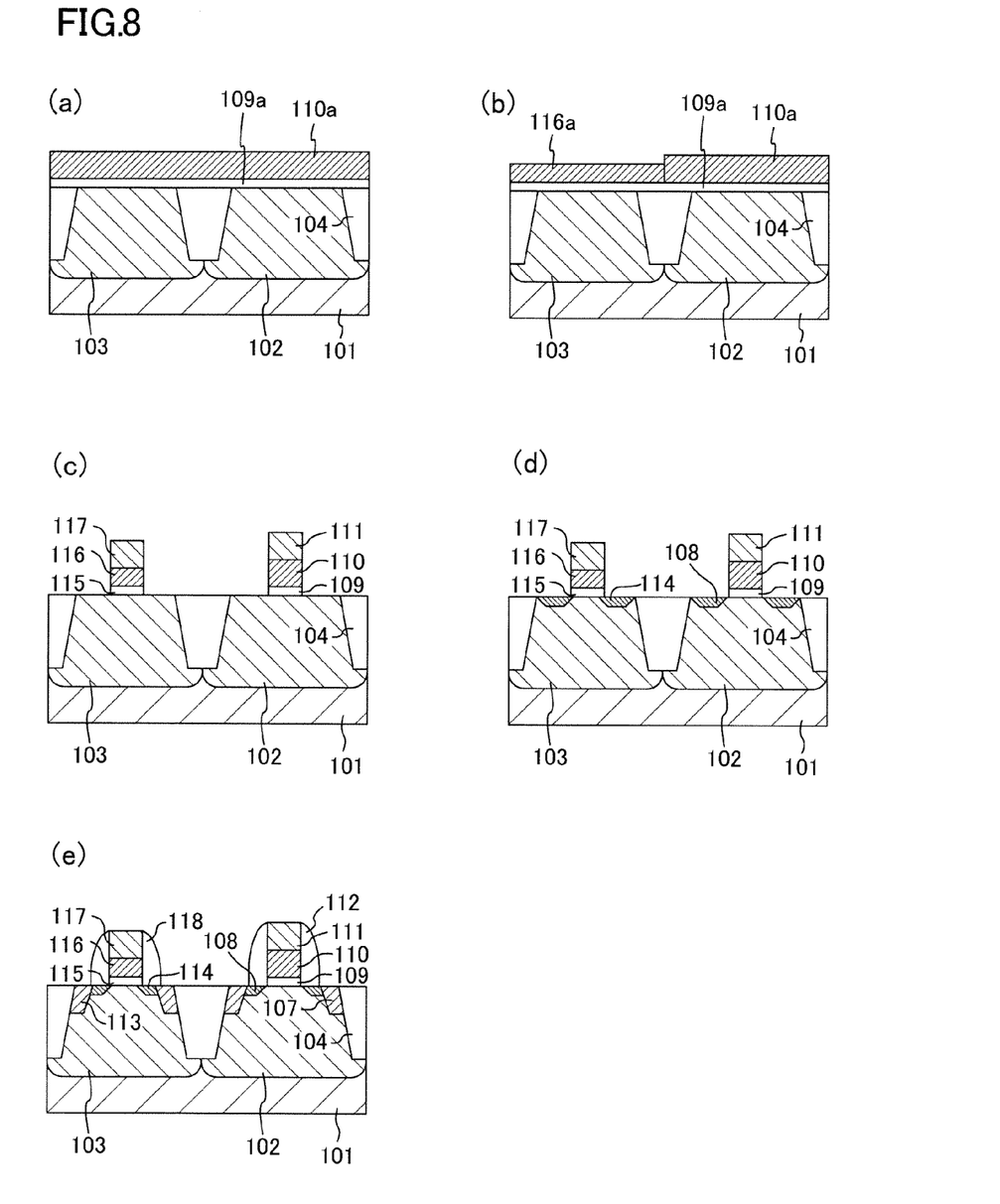
FIGS. 8A-8E are cross-sectional views illustrating a manufacturing method of the semiconductor device according to the first embodiment.

First, in the step shown in FIG. 8A, the n-type well region 102 and the p-type well region 103 isolated and separated by the isolation layer 104 are formed on the semiconductor substrate 101 by known methods. Then, a high-dielectric constant film 109a and a TiN film 110a are sequentially formed on the n-type well region 102 and the p-type well region 103. The "high-k film" denotes a material having a higher dielectric constant than silicon oxide, silicon oxinitride, and silicon nitride; which have been mainly used as a material of a conventional gate insulating film. The high-dielectric constant film 109a is formed as follows. For example, a silicon oxide film with a thickness of about 1.0 nm is formed by oxidizing upper surfaces of the n-type well region 102 and the p-type well region 103 in a water-vapor atmosphere or a nitric oxide atmosphere. Then, an oxide containing a Group IV element such as Hf, Zr, etc. as a main component; an oxide of Hf, Zr, etc. and Si called "silicate;" an oxide of Hf, Zr, etc. and Al called "aluminate;" or an oxinitride of such elements to which nitrogen is added by plasma nitridation or ammonia nitridation; is deposited on the silicon oxide film, thereby forming the high-dielectric constant film 109a. Metal organic chemical vapor deposition (MOCVD), atomic layer deposition (ALD), physical vapor deposition (PVD), etc are used for forming the gate insulating film made of a high-k material. When nitrogen processing is added, heat treatment at a temperature of 1000° C. or more is preferably added.

Figure 9:
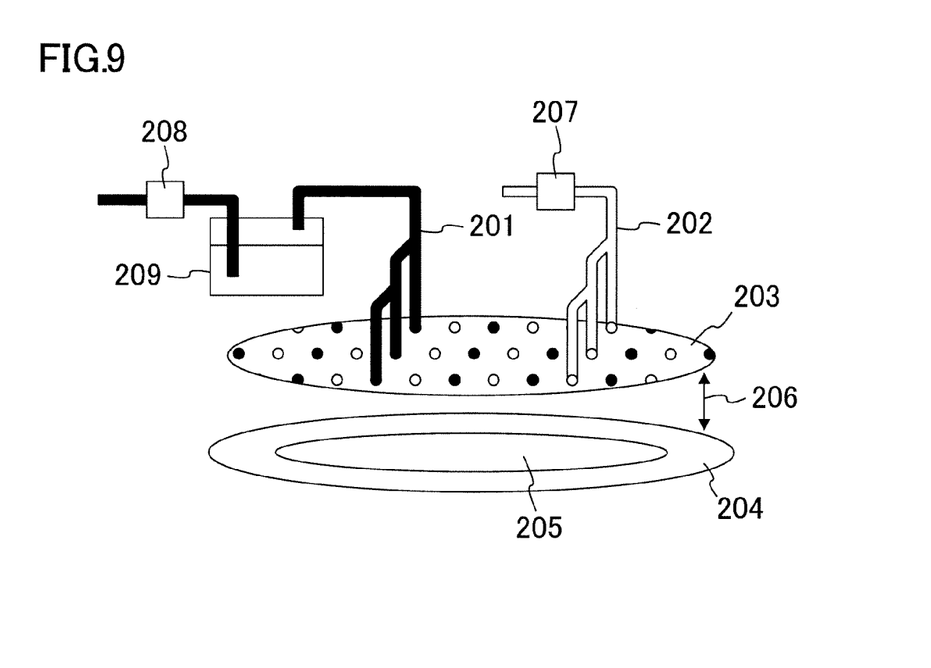
FIG. 9 illustrates a schematic structure of an apparatus for forming the TiN film.

The TiN film 110a is formed by ALD with a single-wafer film formation apparatus shown in FIG. 9. In the single-wafer film formation apparatus, a plate referred to as a "shower plate 203" including a plurality of gas supply ports 201 and 202 is arranged in parallel with a stage heater 204 on which a semiconductor substrate is provided. The gas supply ports 201 and 202 are independently arranged from each other. The gas supply port 201 is a supply port for Ti source gas, and the gas supply port 202 is a supply port for nitrogen source gas. The space between the stage heater 204 and the shower plate 203 is variable within the range from 5 mm to 50 mm. With the space, the volume in a chamber can be freely changed. The supply amounts of the Ti source gas and the nitrogen source gas are controlled by mass flow controllers 208 and 207, respectively.

The flow amount and supply time of the gas are controlled by a differential pressure control valve, which can control opening and closing at an interval of 0.01 second or more. The gas supply shown in, e.g., FIG. 4 is repeated, thereby forming a film at the level of an atomic layer. Since extremely high-speed switching of gas is required, the volume of the camber is preferably as small as possible. The space between the stage heater and the shower plate is set to a suitable value (e.g., the most suitable value) for the type of a film.

Gas supply is, for example, performed as follows. In a liquid gas bubbler cabinet 209, titanium chloride gas, which is evaporated by bubbling a liquid source such as titanium chloride ($TiCl_4$) being a Ti source with inert gas such as Ar, is supplied to the chamber for t1 =0.05 seconds (see FIG. 4) to allow Ti to adsorb onto the high-k gate insulating film.

Next, in order to discharge the titanium chloride gas filling the chamber, nitrogen gas is supplied at a flow amount of, e.g., 1000 mL/min (sccm) for t2=0.3 seconds. After that, ammonia being nitrogen source gas is supplied at, e.g., 1000 mL/min (sccm) for t3=1 second to bond to the adsorbing Ti.

Then, in order to remove the ammonia gas filling the chamber, nitrogen gas is supplied at the flow amount of 1000 mL/min (sccm) for about t4 =1 second. The series of the gas supply is referred to as one cycle, and the thickness of a film formed in one cycle is referred to as a deposition rate (film formation rate). In the case of TiN, there is a slight change in the deposition rate when the temperature ranges from 400° C. to 600° C., and the deposition rate is almost independent of the flow amount of the gas supply. As described above, the deposition rate largely depends on the pressure in the chamber, and depends on the space between the shower plate 203 and a wafer 205 (the stage heater 204). While crystallinity is difficult to modulate by changing the deposition rate in CVD and PVD, the crystal orientation of TiN can be freely changed by changing the deposition rate per one cycle of ALD, which can control atomic layers.

In this embodiment, the TiN film 110a is provided on the entire surface of the high-dielectric constant film 109a, has crystallinity in which the ratio of (111) orientation/(200) orientation is 1.5 or more, and is formed with a thickness ranging from 15 nm to 25 nm. The film is formed under the conditions where the pressure in the chamber is 66.7 Pa (0.5 Torr), the space between the shower plate 203 and the wafer 205 is 25 nm, the temperature of the stage heater is 550° C., and the flow amount and the flow time of the gas are as described above. The source gas used in this method is not limited to the combination of titanium chloride and ammonia, an amino material and an imide material may be used as a Ti source, and as a nitrogen source, plasma may be applied to ammonia to expose an ammonia radical.

Then, in the step shown in FIG. 8B, resist is applied to the entire surface of the TiN film 110a, and an NMOS formation region (not shown) is opened by photolithography. Furthermore, a part of the TiN film 110a provided in the NMOS formation region is removed with a mixture of sulfuric acid and oxygenated water, and the thickness of the TiN film in the NMOS formation region is set within a range from 4 nm to 10 nm. The TiN film in the NMOS formation region is hereinafter referred to as a "TiN film 116a." After that, the resist is removed. The etching of the TiN film 110a in the NMOS formation region is not limited to wet etching and may be dry etching with halogen etching gas.

Next, in the step shown in FIG. 8C, in order to remove a native oxide film formed on the TiN films 110a and 116a, and the TiN layer altered by the application and the removal of the resist; the surfaces of the TiN films 110a and 116a are cleaned with oxygenated water, and then, a polysilicon film with a thickness of 100 nm is formed on the TiN films 110a and 116. This step (i.e., cleaning with oxygenated water) is preferably performed, since an interface resistance rises when an oxide layer exists at the interface between TiN and polysilicon. The polysilicon film may be obtained by forming a film at a temperature of 500° C.-550° C. using silane ($SiH_4$) and disilane ($Si_2H_6$), and then making the film polysilicon by heat treatment; or by forming polysilicon at a temperature of 600° C.-630° C. Also, silane and germane ($GeH_4$) may be added to form a silicon germanium film as a film for an electrode.

After that, a resist pattern for the gate electrodes is formed by photolithography and etching, and the polysilicon film and the TiN films 110a and 116a are anisotropically etched with halogen etching gas. Parts of the polysilicon film becomes the first upper gate electrode 117, and the second upper gate electrode 111. A part of the TiN film 110a becomes the second gate electrode 110. A part of the TiN film 116a becomes the first gate electrode 116. Since the thicknesses of the TiN films are different, when the TiN films 110a and 116a are etched, etching selectivity is set between the TiN films and the high-dielectric constant film 109a made of a high-k material to control the etching to stop at the high-dielectric constant film 109a. Note that sufficient etching selectivity can be obtained when the high-dielectric constant film 109a is subjected to heat treatment at a temperature of 1000° C. or more after forming the TiN films.

Then, a part of the high-dielectric constant film 109a remaining in the gate dry etching is removed by cleaning with a hydrofluoric acid agent to form the first gate insulating film 115 on the p-type well region 103, and the second gate insulating film 109 on the n-type well region 102.

As described above, by the steps shown in FIGS. 8A-8C, the gate insulating films having the same EOTs can be formed in the NMOS formation region (the region in which the NMOS is formed) and in the PMOS formation region (the region in which the PMOS is formed). Furthermore, since the thickness of the first gate electrode 116 for the NMOS is formed small (e.g., 4-10 nm) and the thickness of the second gate electrode 110 for the PMOS is formed large (e.g., 15-25 nm), the gate electrode for the PMOS has a larger work function than the gate electrode of the NMOS.

Next, in the step shown in FIG. 8D, a silicon nitride film is formed at a temperature of 600° C. or less. ALD is the most proper formation method, and for example, dichlorosilane ($SiH_2Cl_2$) and ammonia are alternately supplied to form the film with a thickness of 5 nm-10 nm (not shown). Then, anisotropic dry etching is performed with halogen gas, thereby forming a silicon nitride film (offset sidewalls) on side surfaces of the first gate electrode 116 and the first upper gate electrode 117, and side surfaces of the second gate electrode 110 and the second upper gate electrode 111.

Then, while protecting the n-type well region 102 with resist, n-type impurities such as phosphorus, arsenic, and antimony are ion-implanted into the p-type well region 103. After removing the resist on the n-type well region 102, the p-type well region 103 is protected with resist. Next, p-type impurities such as boron and indium are ion-implanted into the n-type well region 102, and ionic species are activated by heat treatment at a temperature of 1000° C. or more, thereby forming the n-type extension layer 114 in an upper portion of the p-type well region 103, and the p-type extension layer 108 in an upper portion of the n-type well region 102.

After that, in the step shown in FIG. 8E, after continuously forming a silicon oxide film with a thickness of 5 nm-10 nm, and a silicon nitride film with a thickness of 10 nm-30 nm, anisotropic dry etching is performed to form the first side walls 118 on the side surfaces of the first gate electrode 116 and the first upper gate electrode 117, and the second side walls 112 on the side surfaces of the second gate electrode 110 and the second upper gate electrode 111. The first sidewalls 118 and the second sidewalls 112 are not necessarily formed by two layers but may be formed by a single silicon oxide film or a single silicon nitride film.

Then, while protecting the n-type well region 102 with resist, n-type impurities such as phosphorus, arsenic, and antimony are ion-implanted into the p-type well region 103 to form the n-type impurity diffusion layer 113. Next, the resist in the n-type well region is removed, and the p-type well region 103 is protected with resist. In this state, p-type impurities such as boron and indium are ion-implanted to obtain the p-type impurity diffusion layer 107, and the ionic species of the n-type impurity diffusion layer 113 and the p-type impurity diffusion layer 107 are activated at a temperature of 900° C.-1050° C. to form a source/drain region.

After that, the upper portion of the source/drain region and the upper portions of the first upper gate electrode 117 and the second upper gate electrode 111 are silicided with Ni and Pt. After sequentially forming a silicon nitride film (not shown) serving as an etching stopper when forming a contact hole, and a silicon oxide film (not shown) serving as an interlayer insulating film; the semiconductor device in this embodiment shown in FIG. 1 can be manufactured through a conventional process such as planarization.

An example has been described where crystal orientation of a TiN film is controlled. However, when gate electrodes are formed by tungsten nitride (WN) films or molybdenum nitride (MoN) films, a difference in EOT between a PMOS and an NMOS can be reduced, and work functions of the gate electrodes can be set to appropriate values by controlling the crystal orientation.

Second Embodiment

Figure 10:
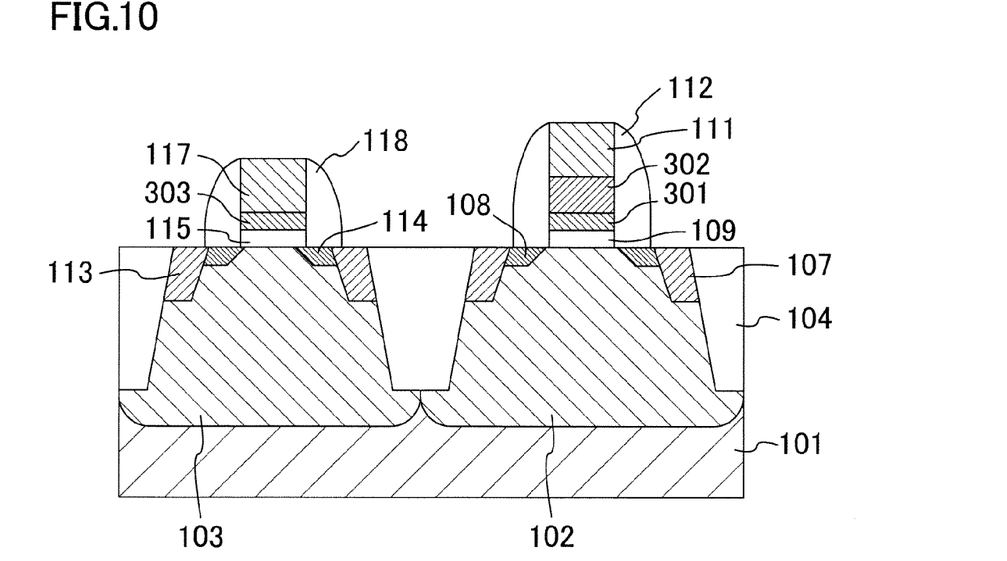
FIG. 10 is a cross-sectional view illustrating a schematic structure of a semiconductor device according to a second embodiment of the present disclosure.

FIG. 10 is a cross-sectional view illustrating a schematic structure of a semiconductor device according to a second embodiment of the present disclosure. In the figure, the same reference characters as those shown in FIG. 1 are used to represent equivalent elements. Different features from those in the first embodiment will be mainly described below.

As shown in FIG. 10, the semiconductor device in this embodiment differs from the semiconductor device in the first embodiment in that the gate electrode made of TiN is formed by two layers in the PMOS. Specifically, a lower layer gate electrode 301, an upper layer gate electrode 302, and the second upper gate electrode 111 are sequentially provided from bottom on the second gate insulating film 109 of the PMOS. The lower layer gate electrode 301 made of TiN has the same crystal orientation and thickness as a first gate electrode 303 of the NMOS. The upper layer gate electrode 302 made of TiN has a different crystal orientation from the lower layer gate electrode 301. In each of the first gate electrode 303 and the lower layer gate electrode 301, the ratio of (111) orientation/(200) orientation ranges from 0.8 to 1.2, and the thickness ranges from 4 nm to 10 nm. In the upper layer gate electrode 302, the ratio of (111) orientation/(200) orientation is about 1.5, and the thickness ranges, e.g., from about 5 nm to about 20 nm. The total thicknesses of the lower layer gate electrode 301 and the upper layer gate electrode 302 is 15 nm or more.

Next, a manufacturing method of the semiconductor device in this embodiment will be described below. FIGS. 11A-11D are cross-sectional views illustrating the method of the semiconductor device according to the second embodiment.

Figure 11:
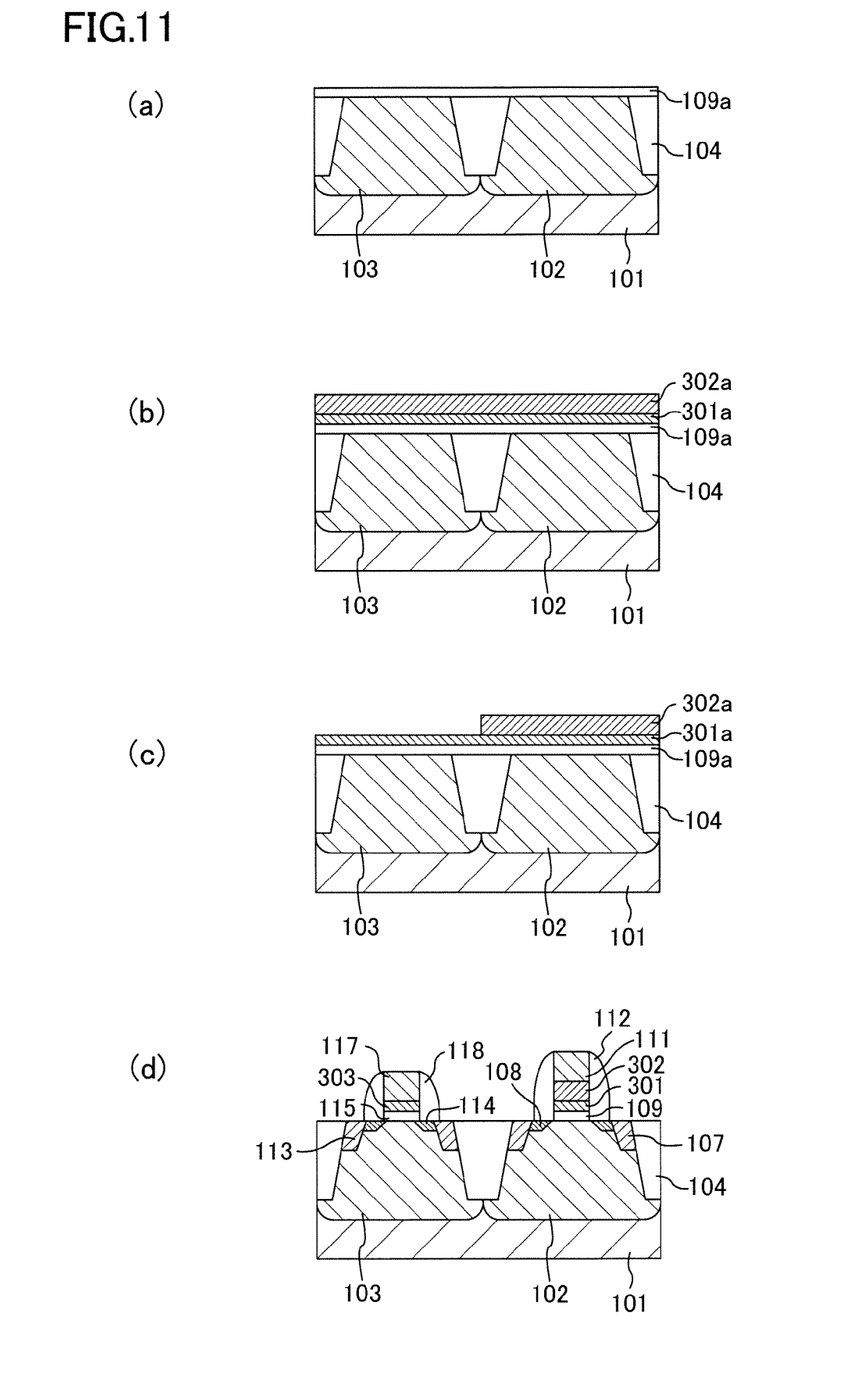
FIGS. 11A-11D are cross-sectional views illustrating a manufacturing method of the semiconductor device according to the second embodiment.

First, as shown in FIG. 11A, the method in this embodiment has the same steps as the method in the first embodiment to the step forming the high-dielectric constant film 109a. The steps after formation of a first TiN film 301a and a second TiN film 302a are the same as those in the first embodiment shown in FIGS. 8C-8E.

In the step shown in FIG. 11B, the first TiN film 301a, in which the ratio of (111) orientation/(200) orientation ranges about 0.8 to 1.2 and which has a thickness ranging from 4 nm to 10 nm, is formed on the high-dielectric constant film 109a. As shown in FIG. 2, when the crystal of the (111) orientation and the crystal of the (200) orientation are contained in substantially a same ratio, the EOT of the TiN film is minimum where the thickness of the TiN film is around 5 nm, and then, monotonously increases with an increase in the thickness of the TiN film.

Furthermore, the second TiN film 302a, in which the ratio of (111) orientation/(200) orientation is 1.5 or more and crystal orientation (111) is dominant, is deposited on the first TiN film 301a in which the ratio of (111) orientation/(200) orientation ranges from 0.8 to 1.2.

As such, in the semiconductor device according to this embodiment, the second TiN film 302a is stacked on the first TiN film 301a to reduce fluctuations in the EOT. This is considered because crystal discontinuity occurs and formation of the (200) plane causing fluctuations in the EOT is reduced by stacking the films.

In the method of this embodiment, supply time and supply amount of source gas when forming the first TiN film 301a are the same as those in the first embodiment shown in FIG. 4. This embodiment differs from the first embodiment in that pressure in a chamber is set to 400 Pa (3.0 Ton) or more, and the space between the shower plate and the wafer is reduced to 20 mm or less (e.g., 17 mm). As such, by controlling the pressure in the chamber and the volume of the chamber, TiN including crystal orientation (111) and (200) in substantially a same ratio can be formed as indicated by graph B in FIG. 3.

As indicated by graph B in FIG. 5, the deposition rate is about 0.075 nm/cycle.

When forming the second TiN film 302a in which the (111) plane is dominant, the wafer may be retained in the chamber and may be continuously formed, and may be placed in the chamber after being open to the air. As described in the first embodiment, the second TiN film 302a in which the (111) plane is dominant is formed under the conditions where the pressure in the chamber is 66.7 Pa (0.5 Ton) or less, and the space between the shower plate (gas supply port) and the wafer is 25 mm or more. Note that the wafer stage temperature is 550° C. and the flow amount of gas and gas purge time are as shown in FIG. 4.

Next, in the step shown in FIG. 11C, while protecting the n-type well region 102 with resist, the second TiN film 302a in the NMOS formation region is etched with a mixture of sulfuric acid and oxygenated water. At this time, when a native oxide layer exists between the first TiN film 301a and the second TiN film 302a, it serves as an etching stopper. However, when the first TiN film 301a and the second TiN film 302a are continuously formed in the chamber, etching is hardly stopped. Thus, etching time is estimated based on the etching rate so that the second TiN film 302a with a thickness of 4-10 nm remains in the NMOS formation region. When the etching is stopped by the native oxide layer between the first TiN film 301a and the second TiN film 302a, the original thickness of the first TiN film 301a is the thickness of the first TiN film 301a in the NMOS formation region.

After that, through the step shown in FIG. 11D, a part of the first TiN film 301a becomes the lower layer gate electrode 301, and a part of the second TiN film 302a becomes the upper layer gate electrode 302. A part of the first TiN film 301a provided on the NMOS formation region becomes the first gate electrode 303. As such, the semiconductor device in this embodiment is manufactured.

Figure 12:
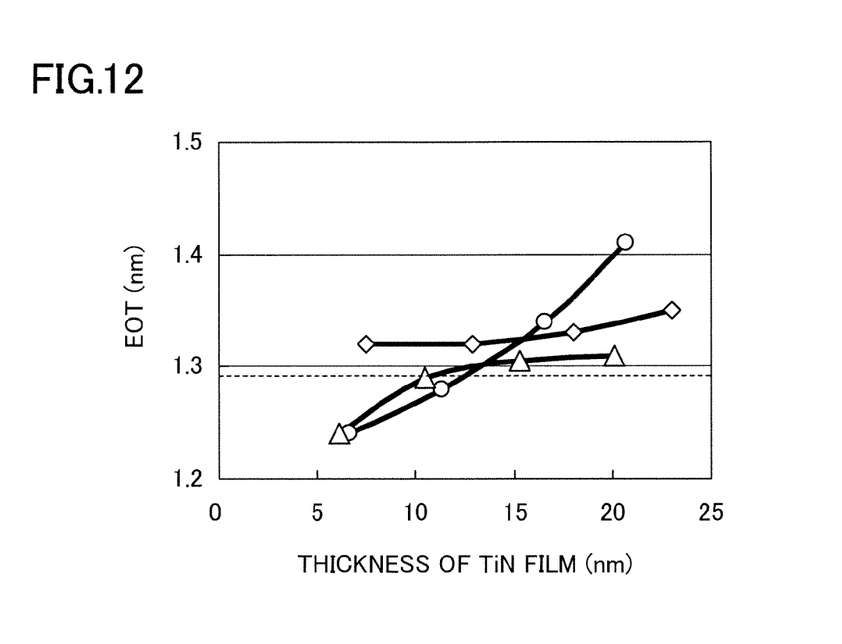
FIG. 12 illustrates a change in the EOT where a second TiN film, of which thickness is changed to 5, 10 and 15 nm, is formed on a first TiN film including crystal orientation (111) and (200) in substantially a same ratio.

FIG. 12 illustrates a change in the EOT where a second TiN film, of which thickness is changed to 5, 10 and 15 nm, is formed on a first TiN film including crystal orientation (111) and (200) in substantially a same ratio. In the figure, the vertical axis represents the EOT, and the horizontal axis represents the total thickness of the first TiN film and the second TiN film.

It is found from FIG. 12, as compared to the case where a single layer TiN film (the graph with squares in the figure) is used as a gate electrode to mitigate an increase in the EOT, the EOT of a double layer TiN film (the graph with triangles in the figure) slightly differs from the EOT of a film including the high-k gate insulating film and the polysilicon gate electrode (i.e., the EOT where the thickness of the TiN film is 0 nm) indicated by the dashed line in FIG. 12. Note that the graph with circles in FIG. 12 is identical to the graph B in FIG. 2.

As described above, the lower layer of the gate electrode for the PMOS is formed by a TiN film including the crystal orientation (111) and (200) in substantially a same ratio, and the upper layer is formed by a TiN film, in which the (111) crystal orientation is dominant, i.e., the ratio of (111) orientation/(200) orientation is 1.5 or more, thereby mitigating an increase in the EOT of the PMOS. Thus, even when the gate electrodes of the NMOS and the PMOS have different thicknesses, a desirable work function can be obtained, and the difference in the EOT between the NMOS and the PMOS can be reduced. Furthermore, the EOT itself can be reduced as compared to conventional techniques. Therefore, according to the semiconductor device in this embodiment, a high-function CMOS transistor can be realized even when the transistor is miniaturized.

The crystallinity of the first gate electrode 303, the lower layer gate electrode 301, and the upper layer gate electrode 302 is not limited to that described above, the lower layer gate electrode 301 may be made of TiN having the crystal orientation in which the ratio of (111) orientation/(200) orientation ranges from 0.8 to 1.2, and the upper layer gate electrode 302 and the first gate electrode 303 may be made of TiN having the crystal orientation in which the ratio of (111) orientation/(200) orientation is 1.5 or more. Alternately, the lower layer gate electrode 301 may be made of TiN having the crystal orientation in which the ratio of (111) orientation/(200) orientation is 1.5 or more, and the upper layer gate electrode 302 and the first gate electrode 303 may be made of TiN having the crystal orientation in which the ratio of (111) orientation/(200) orientation ranges from 0.8 to 1.2. The gate electrode of the PMOS made of TiN crystal may include at least as a part, a TiN layer in which the ratio of (111) orientation/(200) orientation is 1.5 or more.

Third Embodiment

Figure 13:
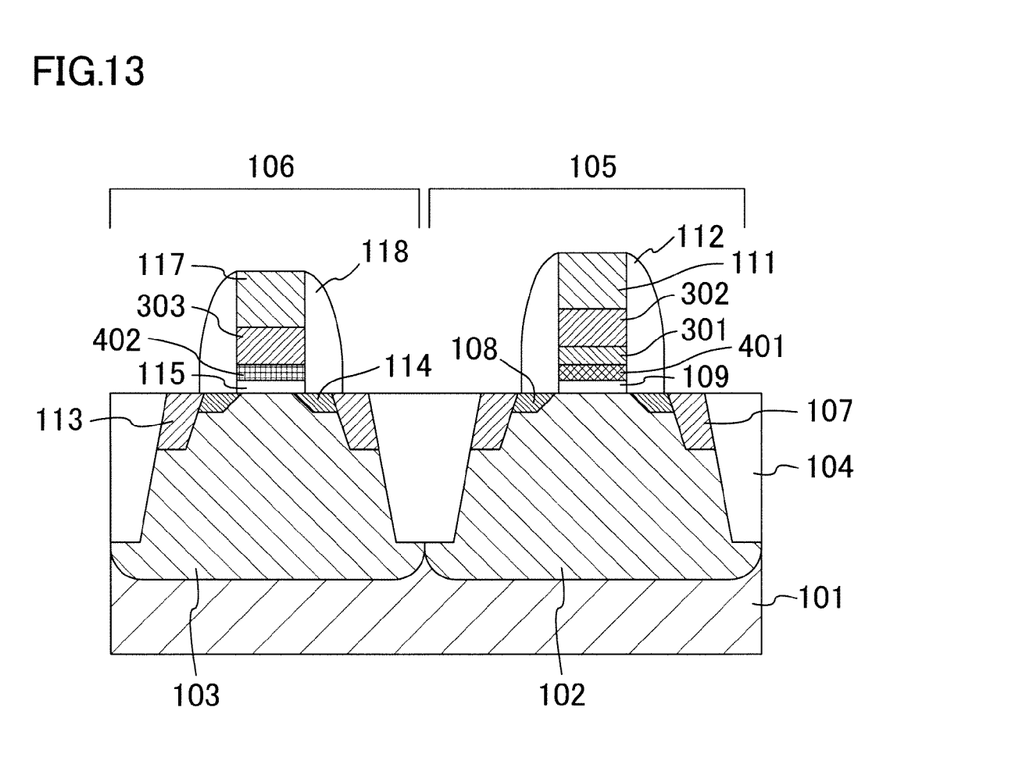
FIG. 13 is a cross-sectional view illustrating a schematic structure of a semiconductor device according to a third embodiment of the present disclosure.

FIG. 13 is a cross-sectional view illustrating a schematic structure of a semiconductor device according to a third embodiment of the present disclosure. In the figure, the same reference characters as those shown in FIG. 10 are used to represent equivalent elements. Different features from those in the second embodiment will be mainly described below.

In the semiconductor device according to this embodiment, a first element segregation layer 402 made of a La oxide or a Mg oxide is provided between the first gate insulating film 115 and the first gate electrode 303. A second element segregation layer 401 made of an Al oxide or a Ta oxide is provided between the second gate insulating film 109 and the lower layer gate electrode 301 made of TiN. Furthermore, in the semiconductor device according to this embodiment, La atoms or Mg atoms segregate in the upper portion (inside) of the first gate insulating film 115 or on the top surface of the first gate insulating film 115. Al atoms or Ta atoms segregate in the upper portion (inside) of the second gate insulating film 109 or on the top surface of the second gate insulating film 109.

The first gate electrode 303 and the first upper gate electrode 117 are sequentially formed on the first element segregation layer 402. The lower layer gate electrode 301, the upper layer gate electrode 302, and the second upper gate electrode 111 are sequentially formed on the second element segregation layer 401.

In the semiconductor device according to this embodiment, the element segregation layers are provided between the gate insulating films and the gate electrodes of the MOS transistor to allow atoms to segregate in the gate insulating films. This increases the work function of the gate electrode in the PMOS 105, and reduces the work function of the gate electrode in the NMOS 106, as compared to the semiconductor devices according to the first and second embodiments. Moreover, a high-function CMOS device having a lower threshold voltage at the NMOS 106 can be realized.

Next, a manufacturing method of the semiconductor device in this embodiment will be described. FIGS. 14A-14E are cross-sectional views illustrating the manufacturing method of the semiconductor device according to this embodiment.

Figure 14:
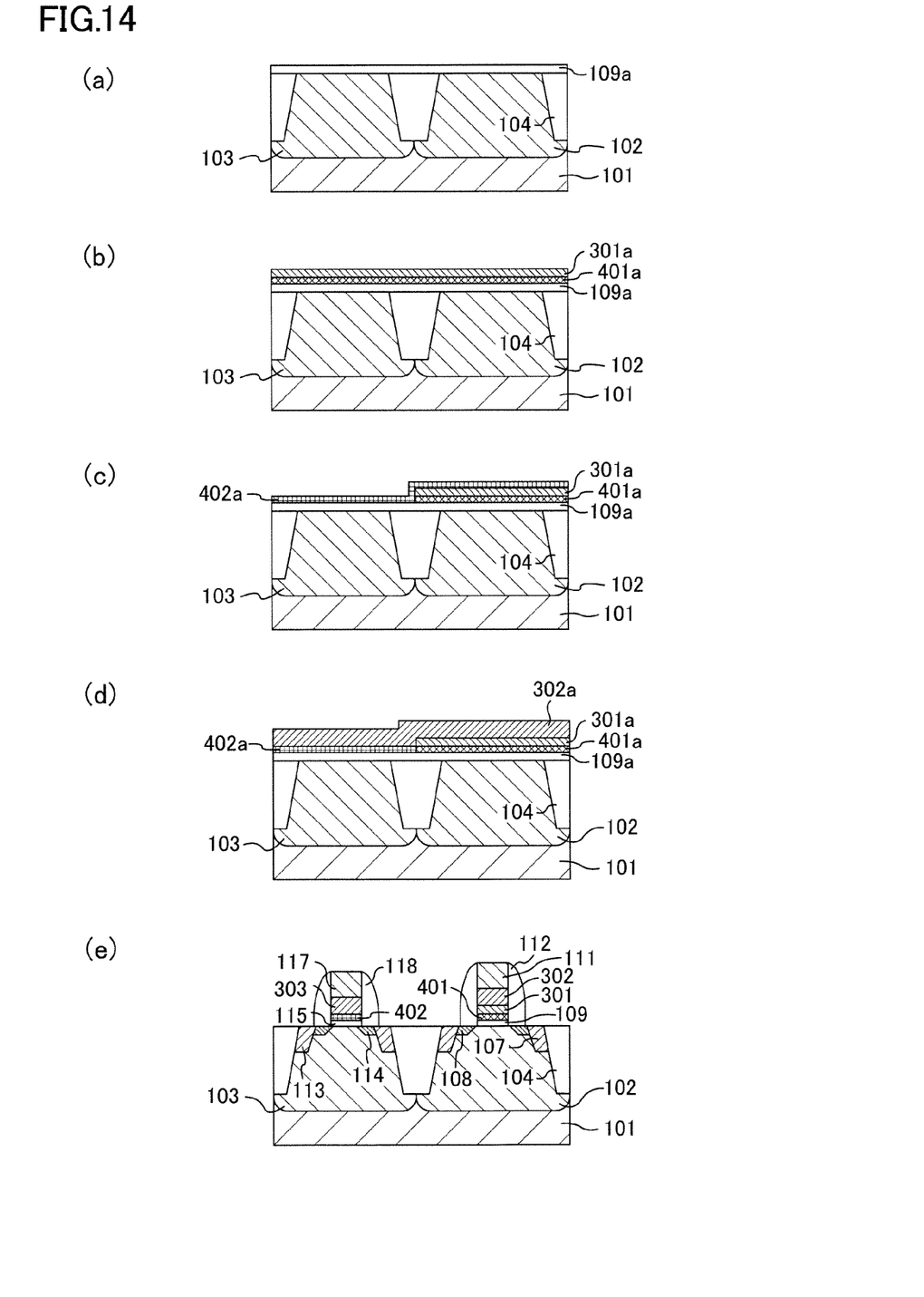
FIGS. 14A-14E are cross-sectional views illustrating a manufacturing method of the semiconductor device according to the third embodiment.

In the manufacturing method according to this embodiment, as shown in FIG. 14A, similar steps to those in the second embodiment shown in FIG. 11A are provided to the step of forming the high-dielectric constant film 109a. The steps after formation of the polysilicon film serving as an upper gate electrode are the same as those in the first and second embodiments, and the explanation thereof will be omitted.

In the step shown in FIG. 14B, after forming the high-dielectric constant film 109a, a second segregation layer 401a is formed on the high-dielectric constant film 109a. The segregating atoms are preferably Al or Ta, and the second segregation layer 401a may be made of an oxide or a nitride of Al or Ta. ALD, PVD, etc. are used as the formation method.

When the second segregation layer 401a is made of aluminum oxide ($Al_2O_3$), the EOT of the gate insulating film tends to increase, since $Al_2O_3$ has a low dielectric constant. Thus, the thickness of $Al_2O_3$ is within the range from 0.2 to 0.5 nm. Since the thickness ranges from 1 atomic layer to 3 atomic layers, a dose amount can be used regardless of the dimension of the thickness. In this case, the dose amount ranges from $2.0 \times 10^{14}$ (atoms/cm$^2$) to $1.0 \times 10^{15}$ (atoms/cm$^2$).

Next, the first TiN film 301a is formed on the entire surface of the second segregation layer 401a. In this embodiment, the first TiN film 301a with a thickness of 4-6 nm in which the ratio of (111)/(200) crystal orientation ranges from 0.8 to 1.2 is formed to cancel an anticipated increase in the EOT caused by allowing Al etc. to segregate in the first and second gate insulating films in a later step. As shown in FIG. 2, when the ratio of (111)/(200) crystal orientation is around 1.0, the increase in the thickness of $Al_2O_3$ can be canceled, since the EOT decreases much where the thickness ranges from 4 nm to 6 nm as compared to other cases.

Then, in the step shown in FIG. 14C, while covering the PMOS formation region with resist, the first TiN film 301a and the second segregation layer 401a in the NMOS formation region are removed with a mixture of sulfuric acid and oxygenated water. At this time, the high-dielectric constant film 109a containing $Al_2O_3$ serves as an etching stopper. Note that Al contained in the second segregation layer 401 is preferably not diffused, and thermal annealing etc. for diffusing Al is not performed. After removing the resist, a first segregation layer 402a is formed on the high-dielectric constant film 109a and the first TiN film 301a. The segregating atoms are preferably La or Mg, and the first segregation layer 402a may be made of an oxide or a nitride of La or Mg. ALD, PVD, etc. are used as the formation method.

Since $La_2O_5$ has a higher dielectric constant than $Al_2O_3$, the change in the EOT is small, and the film can be formed with a thickness of about 0.5 nm-1.0 nm, even when La segregates. However, since the film is hygroscopic, heat treatment is performed at a temperature of 500-100° C. after forming the $La_2O_5$ film to diffuse La into the high-dielectric constant film 109a. In this step, La is formed at first, by PVD etc. with a thickness of 0.5-1.0 nm. Without exposing in the air, heat treatment at the temperature is continuously performed. At this time, while La is diffused into the part of the high-dielectric constant film 109a which is provided in the NMOS formation region, La is also diffused into the first TiN film in the PMOS formation region to a depth of about 1-2 nm.

The work function decreases depending on the amount of segregating La atoms diffused into the high-dielectric constant film 109a in the NMOS formation region. The work function can be controlled together with the thickness of the $La_2O_5$ film by controlling the temperature and time of the heat treatment.

Next, a TiLaON layer formed on the first TiN film 301a is selectively removed with hydrochloric acid. A hydrate of $La_2O_5$, which could not be diffused into the high-dielectric constant film 109a by the heat treatment, exists on the high-dielectric constant film 109a in the NMOS formation region.

The hydrate is also removed with the hydrochloric acid so that only a La oxide, which is thermally diffused into the high-dielectric constant film 109a, segregates in the high-dielectric constant film 109a.

Then, in the step shown in FIG. 14D, the second TiN film 302a is formed, which becomes the first gate electrode 303 of the NMOS and the upper layer gate electrode 302 later. When forming the second TiN film 302a, TiN, in which the ratio of (111) orientation/(200) orientation is 1.5 or more, is formed with a thickness ranging from 5 nm to 15 nm to mitigate an increase in the EOT in the PMOS.

After that, in the step shown in FIG. 14E, after forming a polysilicon film; the polysilicon film, the second TiN film 302a, the first TiN film 301a, the first segregation layer 402a, the second segregation layer 401a, and the high-dielectric constant film 109a are etched by a predetermined method. As a result, the first gate insulating film 115, the first element segregation layer 402 made of $La_2O_5$ etc., the first gate electrode 303 made of TiN, and the first upper gate electrode 117 made of polysilicon are sequentially formed from bottom on the p-type well region 103. Also, the second gate insulating film 109, the second element segregation layer 401 made of $Al_2O_3$ etc., the lower layer gate electrode 301 made of TiN, the upper layer gate electrode 302 made of TiN, and the second upper gate electrode 111 made of polysilicon are sequentially formed from bottom on the n-type well region 102.

The work function of the gate electrode of the PMOS can be controlled by the thickness of the second element segregation layer 401, and the thicknesses of the lower layer gate electrode 301 and the upper layer gate electrode 302. The work function of the gate electrode of the NMOS can be controlled by the amount of the $La_2O_5$ diffused into the first gate insulating film 115 and the thickness of the first gate electrode 303.

The EOT in the PMOS can be controlled by the thickness of the second element segregation layer 401 and the thickness of the lower layer gate electrode 301 in which the ratio of (111) orientation/(200) orientation is about 1.0. The EOT in the NMOS can be controlled by the amount of the $La_2O_5$ diffused into the first gate insulating film 115.

As such, according to the manufacturing method of the semiconductor device in this embodiment, the element segregation layers are provided between the gate insulating films and the gate electrodes in the MOS transistor so that atoms segregate in the gate insulating films. This increases the work function of the gate electrode in the PMOS, and reduces the work function of the gate electrode in the NMOS, as compared to the semiconductor devices according to the first and second embodiments. Moreover, a high-function CMOS device having a lower threshold voltage at the NMOS can be realized without increasing the EOT.

As described above, the semiconductor device and the method of manufacturing the semiconductor device are preferably used for various electronic devices using semiconductor integrated circuits.

What is claimed is:

1. A semiconductor device comprising:
   a semiconductor substrate including a p-type layer and an n-type layer in an upper portion;
   an n-channel MOS transistor including
      a first gate insulating film provided on the p-type layer,
      a first gate electrode provided on the first gate insulating film and made of TiN, and
      a first upper gate electrode provided on the first gate electrode and made of semiconductor doped with impurities; and
   a p-channel MOS transistor including
      a second gate insulating film provided on the n-type layer,
      a second gate electrode provided on the second gate insulating film and made of TiN, and
      a second upper gate electrode provided on the second gate electrode and made of semiconductor doped with impurities,
   wherein the second gate electrode has a thickness of about 15 nm to about 25 nm, and
   the second gate electrode includes a first TiN layer, the first TiN layer is made of TiN crystal in which the ratio of (111) orientation/(200) orientation is about 1.5 or more.

2. The semiconductor device of claim 1, wherein
   the entire second gate electrode is made of TiN crystal in which the ratio of (111) orientation/(200) orientation is about 1.5 or more, and
   the first gate electrode is made of TiN crystal in which the ratio of (111) orientation/(200) orientation is about 1.5 or more, and which has a smaller thickness than the second gate electrode.

3. The semiconductor device of claim 1, wherein
   the first gate electrode is made of TiN crystal in which the ratio of (111) orientation/(200) orientation ranges from about 0.8 to about 1.2, and
   the first gate electrode has a thickness ranging from about 4 nm to about 10 nm.

4. The semiconductor device of claim 1, wherein
   the second gate electrode further includes
      a second TiN layer made of TiN crystal in which the ratio of (111) orientation/(200) orientation ranges from about 0.8 to about 1.2.

5. The semiconductor device of claim 1 wherein
   La or Mg is contained inside the first gate insulating film, or at an interface between the first gate insulating film and the first gate electrode, and
   Al or Ta is contained inside the second gate insulating film, or at an interface between the second gate insulating film and the second gate electrode.

6. The semiconductor device of claim 1 wherein
   the first gate insulating film and the second gate insulating film are made of a high-dielectric constant material.

7. The semiconductor device of claim 1, wherein the second gate insulating film has an equivalent oxide thickness of about 1.4 nm or less.

8. The semiconductor device of claim 1, wherein the second gate electrode includes a TiN layer formed by an atomic layer deposition method.

9. The semiconductor device of claim 1, wherein the first TiN layer is deposited at a deposition rate of about 0.075 nm/cycle or less.

10. The semiconductor device of claim 1, wherein
    TiN crystal, which constitutes the first TiN layer, is an oblique columnar crystal.

11. The semiconductor device of claim 1, wherein the first gate electrode is in contact with the first upper gate electrode, and
    the second gate electrode is in contact with the second upper gate electrode.

12. The semiconductor device of claim 1, wherein the first TiN layer is deposited at a deposition rate of about 0.06 nm/cycle or less.

* * * * *